(12) United States Patent
Barbier et al.

(10) Patent No.: US 6,249,441 B1
(45) Date of Patent: Jun. 19, 2001

(54) SUPPORT FRAME FOR ELECTRONIC PLUG-IN UNITS

(75) Inventors: Jean-Paul Barbier, Notre Dame de Bondeville; Dominique Feral, Bois-Guillaume, both of (FR)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/445,273

(22) PCT Filed: May 28, 1998

(86) PCT No.: PCT/EP98/03435
 § 371 Date: Mar. 14, 2000
 § 102(e) Date: Mar. 14, 2000

(87) PCT Pub. No.: WO98/56223
 PCT Pub. Date: Dec. 10, 1998

(30) Foreign Application Priority Data

Jun. 4, 1997 (FR) .................................................. 97 06892

(51) Int. Cl.[7] ..................................................... H05K 7/14
(52) U.S. Cl. ..................... 361/796; 361/730; 361/753; 361/801; 361/807; 211/41.17
(58) Field of Search ................................. 361/728–737, 361/752, 753, 796, 797, 801, 802, 807; 439/59; 211/41.17

(56) References Cited

U.S. PATENT DOCUMENTS

| 5,583,750 | 12/1996 | Nakata et al. | 361/816 |
| 5,781,416 | * 7/1998 | Maroney | 361/800 |
| 5,808,871 | * 9/1998 | Rosecan et al. | 361/730 |

FOREIGN PATENT DOCUMENTS

| 43 42 740 A1 | 6/1995 | (DE) . |
| 0 345 996 A3 | 6/1989 | (EP) . |

* cited by examiner

Primary Examiner—Jayprakash N. Gandhi

(57) ABSTRACT

This invention relates to a frame having a backplane and two side panels for supporting electronic plug-in units in an integrating rack wherein the back ends of the side panels have two separate positions for fixing the backplane with respect to the side panels to allow its depth to be adjusted to one-of two positions and the front end of each side panel is coupled to the integrating rack by a bracket having two legs, one leg of each bracket being connected to the integrating rack and the other leg of each bracket containing apertures located to be aligned with other apertures in the side panels for fixing the side panels to the brackets in one of two positions to allow an electronic plug-in unit to be fixed to the integrating rack at one of two positions.

6 Claims, 5 Drawing Sheets

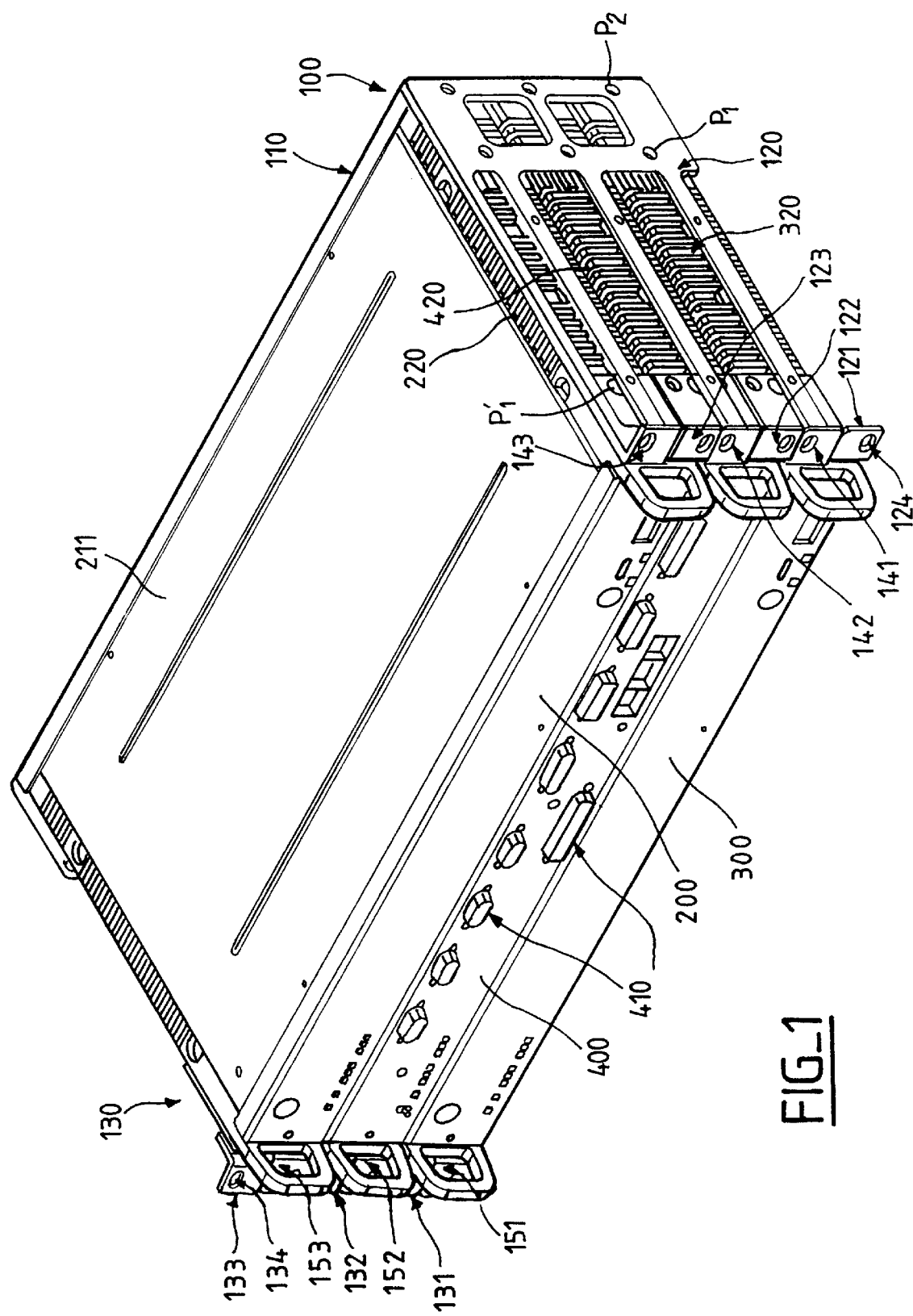
FIG_1

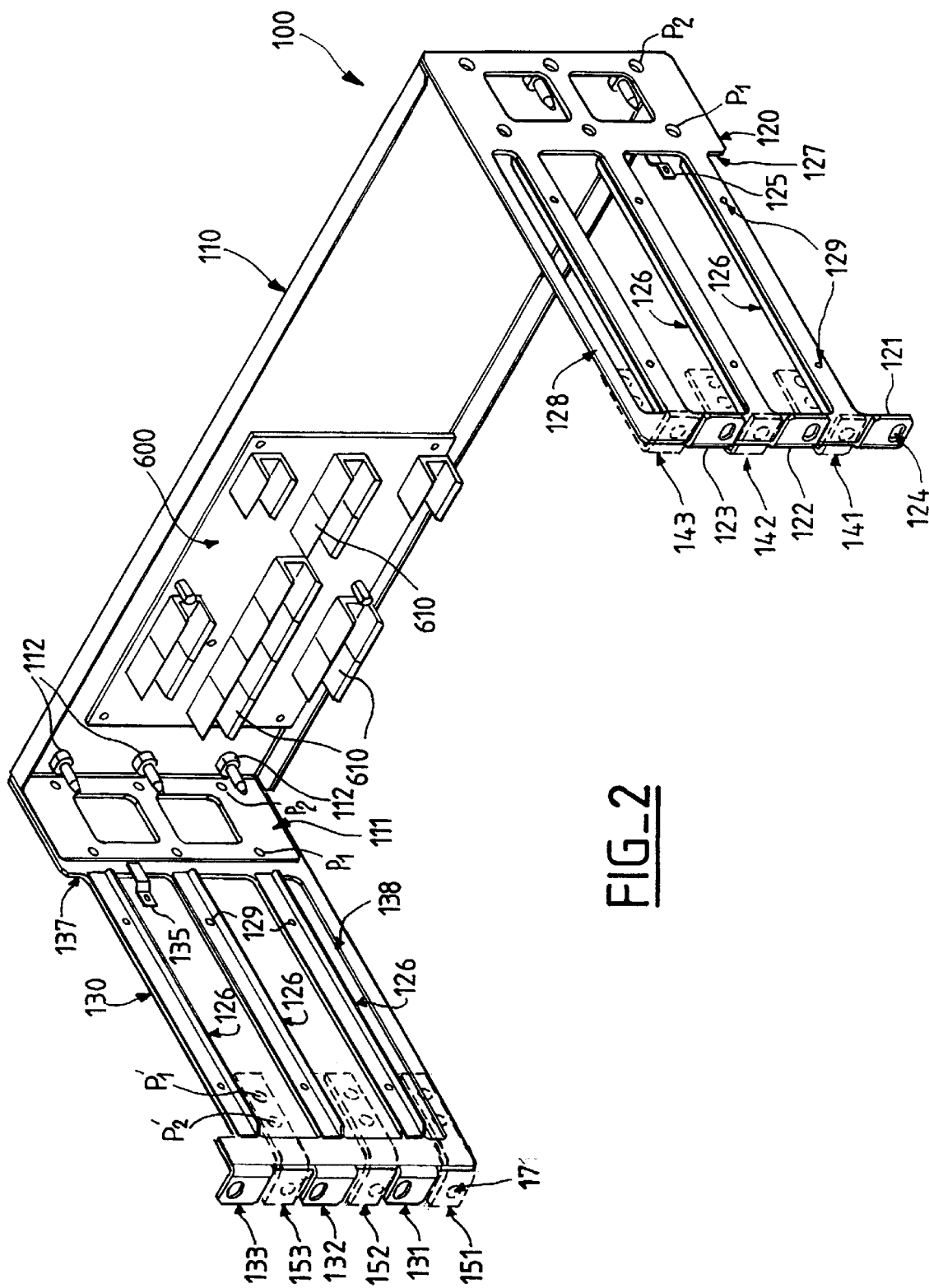
FIG_2

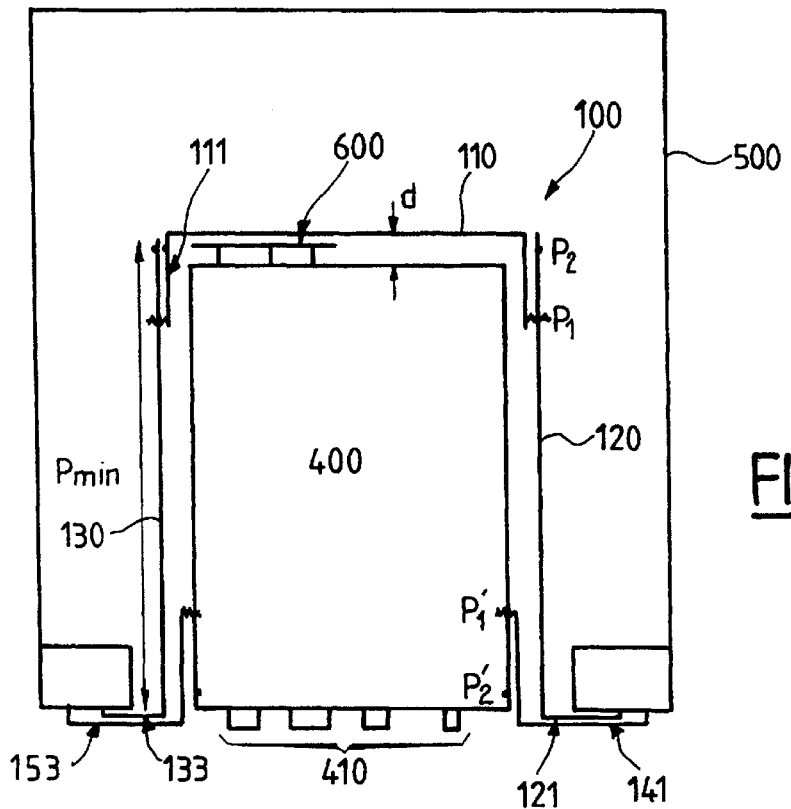
FIG_3A
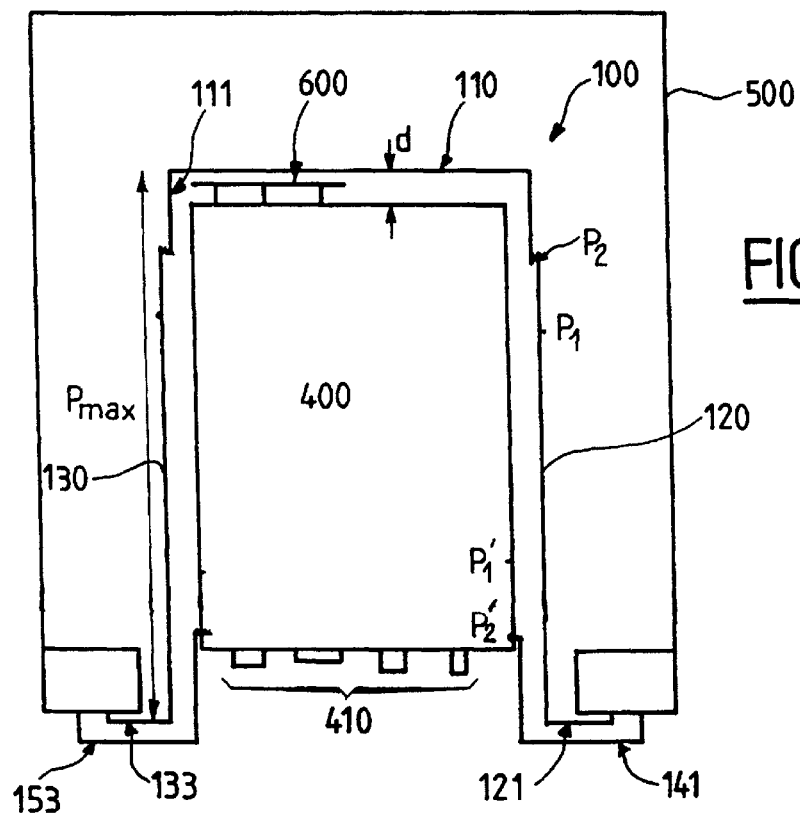
FIG_3B

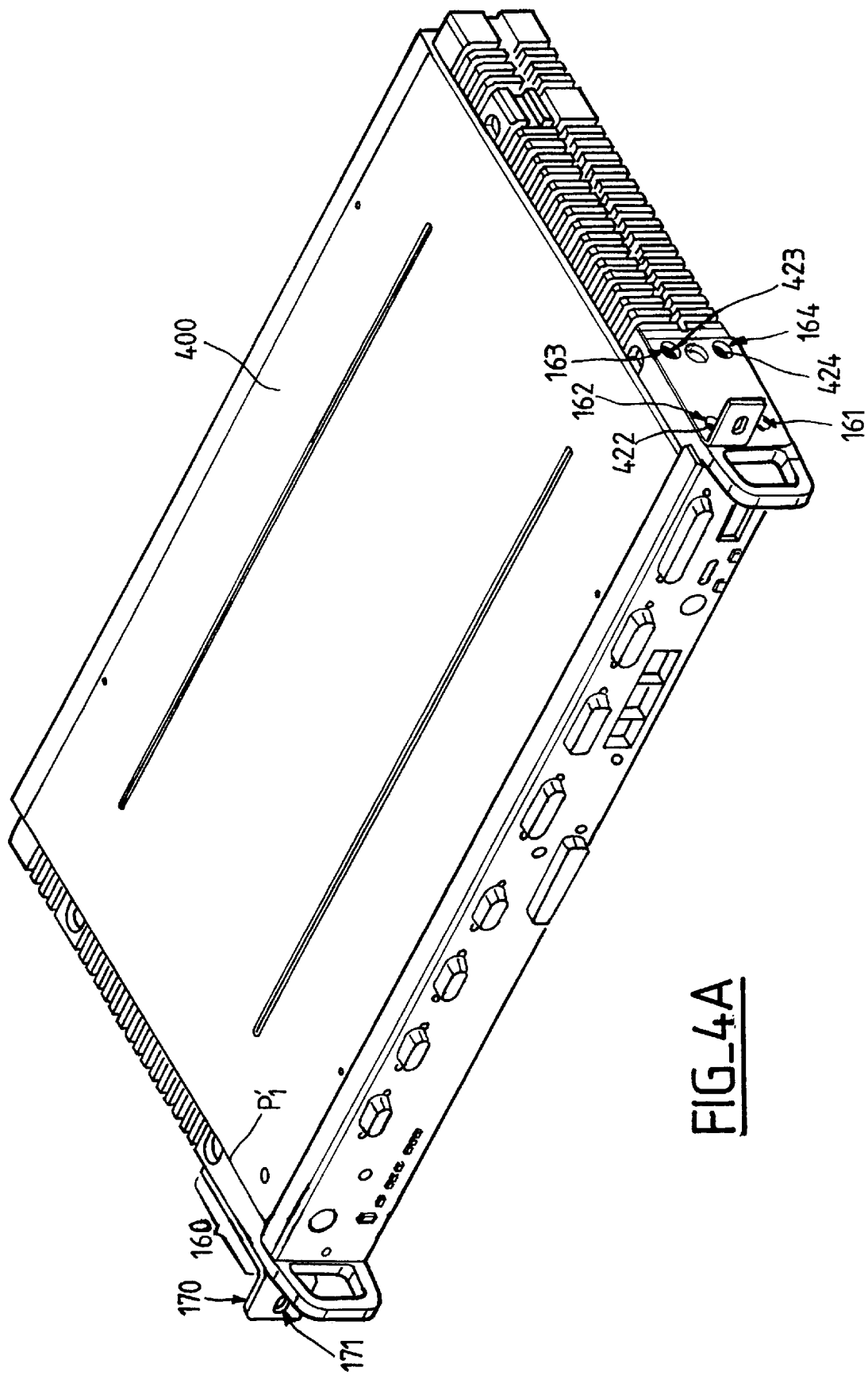
FIG_4A

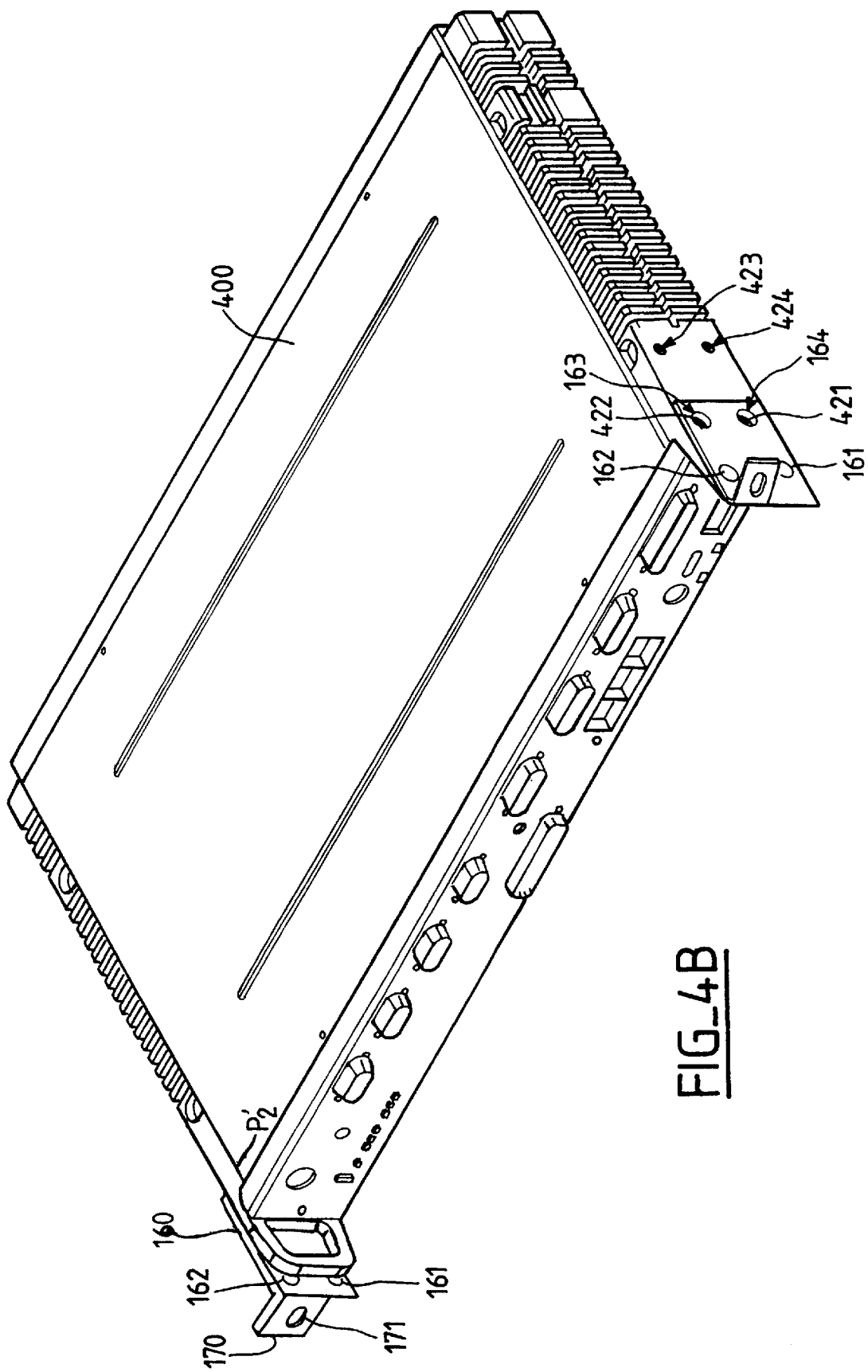
FIG._4B

SUPPORT FRAME FOR ELECTRONIC PLUG-IN UNITS

CROSS-REFERENCE TO RELATED APPLICATION

This application claims priority of French Application No. 97/06892, which was filed on Jun. 4, 1997, and PCT Application No. PCT/EP98/03435, which was filed on May 28, 1998.

BACKGROUND OF THE INVENTION

1. Field of the Invention

The invention relates to a frame which connects electronic plug-in units to an integrating rack.

2. Description of the Prior Art

Electronic plug-in units are used in the Global System for Mobile Communications (GSM) to transmit and/or receive information via radio antennas to which these plug-in units are connected.

In some cases the radio beams thus formed are disturbed by the environment, in particular by foul weather such as rain or snow, for example. These disturbances adversely affect the quality of the radio link.

To remedy this problem, the electronic functions provided by the plug-in units are duplicated, optionally with a frequency change and/or connection of another plug-in unit to another antenna. Moreover, two duplicated plug-in units act as a mutual safeguard.

A security-protected cabinet is often used. This security-protected cabinet is in the form of a frame in which two transmitting/receiving units, also called PRUs (PRocessing Units), and a switching unit are fixed. Furthermore, a motherboard placed on the rear panel of the frame makes it possible to interconnect these three units.

The transmitting/receiving units or PRUs have a multiplexer electronic card, a power converter card and a modem card. Depending on the case, these two PRUs are connected to one and the same external antenna or to two separate external antennas which transmit and/or receive at a different frequency.

As regards the switching unit, this has an electronic switching card and a network management card. When each transmitting/receiving unit or PRU is connected to a separate external antenna, the switching unit firstly analyses the quality of the radio link of each unit and then it switches to the unit which has the better quality. In this case, the function of the switching unit therefore consists in providing a backup for the radio link.

On the other hand, if both transmitting/receiving units or PRUs are connected to one and the same antenna, the switching unit continually analyses the electronic state of these two units and when it detects a fault in a first unit, it switches to the second unit provided as a back-up. In this case, the switching unit makes it possible to manage the replacement of a defective transmitting/receiving unit with a back-up unit.

The invention will be described in this context without, however, being limited to radio-transmission applications or applications of backing up one PRU with another.

The depth of the electronic plug-in units is generally about 240 mm. Moreover, the frame, in which the plug-in units are fixed, is often fitted into and fixed in a standard integrating rack, i.e. in a cabinet, for example, the depth of which is standardized and equal to 450 mm or to 600 mm.

Only the switching unit has, on its front panel, external connection pins allowing it to be connected to other electronic modules.

However, these connection pins often protrude, from the front of the cabinet, so that it becomes impossible to close the door of the cabinet. What is more, because of this protrusion, it often happens that people, passing a little too close to the cabinet, brush against the connection pins, which results in a deterioration of their quality.

To avoid having the connection pins protruding from the front of the cabinet, it would seem to be necessary to move the plug-in units back towards the back of this cabinet. However, the current cabinets do not allow the plug-in units to be moved in the integrating rack. This is because a conventional frame is attached to the integrating rack so that it is impossible to move it towards the rear of the integrating rack. The plug-in units may be attached to the rack and can only be connected to the frame. In addition, the depth of the frame is fixed so that the plug-in units cannot be moved towards the rear of the frame, thereby simplifying their mode of connection. Consequently, from one installation to another, in a field, two types of frames, of different depths, must be available for allowing all requirements to be met.

SUMMARY OF THE INVENTION

The present invention makes it possible to solve this duplication problem since it provides a frame, for supporting the electronic plug-in units, whose depth may be adjusted, it being possible for the electronic plug-in units to be moved back in this frame.

The subject of the invention is more particularly a frame, comprising a backplane and two side panels, which is intended to support electronic plug-in units and to be inserted into an integrating rack. The frame has two positions for fixing the backplane with respect to the side panels so as to allow its depth to be adjusted, in that brackets are incorporated at the front of the side panels in order to allow it to be fixed to the integrating rack and in that other brackets having two positions allow the electronic plug-in units to be fixed to the integrating rack in a position which is set back to a greater or lesser extent.

The frame according to the invention and the electronic plug-in units are fixed to the integrating rack. On the other hand, the electronic plug-in units are not fixed to the frame and can slide along slideways. By virtue of the frame according to the invention and of its fixing system, it is consequently possible to move the electronic plug-in units back with respect to the integrating rack, moving them within the frame whose depth is adjustable. In addition, the frame allows one of the plug-in units to be removed, without dismantling the frame from the rack or dismantling the other two plug-in units from the frame and from the rack.

SUMMARY OF THE INVENTION

FIG. 1 is a perspective view of a frame according to the invention which supports three electronic plug-in units;

FIG. 2 is a perspective view of the frame according to the invention;

FIGS. 3A and 3B are diagrams looking from the top of a frame according to the invention fitted into an integrating rack and containing electronic plug-in units placed respectively flush with the opening in the integrating rack and in a position set back with respect to the integrating rack; and FIGS. 4A and 4B are two perspectives of a bracket fixed in two different positions to a plug-in unit.

DETAILED DESCRIPTION OF THE INVENTION

A frame according to the invention is denoted by the general reference 100 in FIG. 1. This frame has a rear panel 110 called a backplane, and two side panels 120, 130. Three electronic plug-in units 200, 300, 400 are supported by this frame. Two of these plug-in units are transmitting/receiving units or PRUs 200, 300 and the third plug-in unit is a switching unit 400 having, on its front panel, connection pins 410. Preferably, the switching unit 400 is placed between the two PRUs.

There are two different fixing positions P1, P2 for fixing the backplane to the side panels. These two fixing positions P1, P2 thus allow the depth of the frame to be adjusted. In the example illustrated in FIG. 1, the backplane is fixed in a position E1 furthest away from the rear of the side panels. In this case, the depth of the frame is a minimum and can be increased by fixing the backplane to the side panels in the second position P2 lying further to the rear.

Preferably, the side panels of the frame have apertures so as to reveal the lateral radiators 220, 320, 420 of the electronic plug-in units 200, 300, 400 in order to allow the heat to allow the heat dissipated in the plug-in units to be removed to the outside.

The plug-in units are hermetically sealed by top and bottom covers, such as the top cover 211 of the plug-in unit 200 illustrated in FIG. 1, by their lateral radiators, by their front panel and by the backplane 110 of the frame 100 according to the invention. Consequently, these plug-in units are protected from electromagnetic radiation.

Moreover, brackets 121, 122, 123 and 131, 132, 133 are incorporated to the front of the side panels 120 and 130. These brackets have holes 124, 134 capable of receiving screws, for example, in order to allow the frame to be fixed to an integrating rack. The brackets 121, 122, 123 on the one hand and 131, 132, 133 on the other hand form crenels.

Other brackets 141, 142, 143 and 151 152, 153, inserted between the brackets 121, 122, 123 and 131, 132, 133 of the side panels 120 and 130 into the hollows of the crenels, furthermore allow each electronic plug-in unit 200, 300, 400 to be fixed to the integrating rack. These brackets 141, 142, 143 and 151, 152, 153 are fixed, for example by screwing, on the one hand to the side walls of the plug-in units and on the other hand to the integrating rack. These brackets may be fixed to the plug-in units in two different fixing positions. In FIG. 1, these brackets are fixed in a first position P1' lying furthest to the rear with respect to the front panel of the plug-in units. A second fixing position, lying further forward with respect to the front face of the plug-in units, makes it possible to move the plug-in units 141, 142 143, 151, 152, 153 forward with respect to the plug-in units. The way in which the depth of the frame and the position of the plug-in units with respect to the integrating rack are adjusted is described in greater detail below with regard to FIGS. 3A and 3B.

The frame according to the invention is illustrated in greater detail in the perspective shown in FIG. 2. The same references are used to denote the same elements as in FIG. 1. A motherboard 600 is preferably fixed to the backplane 110 in order to interconnect the three electronic plug-in units. In order to make the interconnections, the motherboard has connectors 610 into which the pins lying at the rear of the electronic plug-in units are plugged. The fact of interconnecting the electronic plug-in units by means of a motherboard fixed to a backplane makes it possible to seal the rear panel of these plug-in units and consequently to protect them from electromagnetic radiation.

In one embodiment, it may be envisaged connecting the plug-in units by means of ribbon cables. However, in this case, the plug-in units are not placed in a frame but are fitted directly into an integrating rack, and their rear panel is not sealed so that they are not protected from electromagnetic radiation.

The backplane 110 has two returns 111 which are intended to be fixed to the side panels 120, 130, for example by screwing. These returns have two different fixing positions P1, P2. In the example illustrated in FIG. 2, the returns 111 are fixed in the position P1 furthest to the rear of the side panels so that the depth of the frame is set to its minimum.

Moreover, the side panels 120, 130 have slideways 126, 136 serving as guides when inserting the electronic plug-in units to the frame. Moreover, studs 112 are positioned at each lateral edge of the backplane 110. The electronic plug-in units have, on each of their side wails, a groove intended to slide along a slideway 126, 136 and, at each lateral edge of their rear panel, a recess into which a stud 112 can fit. Thus, the plug-in units are not fixed to the frame but are simply guided into the frame. Furthermore, they are connected to this frame via the backplane card.

The slideways 126, 136 are welded or else screwed to the side panels 120, 130 at reference points 129, 139.

A component 125, 135, placed on each side panel 120, 130 may furthermore be provided in order to allow the frame to be earthed.

The brackets 141, 142, 143 and 151, 152, 153 illustrated by dotted lines are not fixed to these side panels 120, 130 but are inserted between the brackets 121, 122, 123 and 131, 132, 133 incorporated in the side panels. In fact, the brackets 141, 142, 143 and 151, 152, 153 are fixed, on the one hand, to the side walls of the plug-in units and, on the other hand, to the integrating rack. They have a single position 171 for fixing to the integrating rack, but two different positions P1', P2' for fixing to the plug-in units. Thus, when the plug-in units are set back in the frame, the length of the brackets 141, 142, 143, 151, 152, 153 remains the same but the fixing of the plug-in units to the bracket changes so as to be able to keep the brackets fixed to the integrating rack and the plug-in units connected to the card 600 of the backplane.

The side panels 120 and 130 are identical but are turned round through 180° with respect to each other, as illustrated in FIG. 2. Thus, the bottom bracket 121 of the side panel 120 corresponds to the top bracket 133 of the side panel 130 and the step 127 lying in the bottom of the side panel 120 is in the top of the side panel 130, where it has the label 137.

Without the apertured part, labelled 128, 138, on the side panels 120, 130, the frame appears unsymmetrical and unbalanced. This is because on one side the frame rests on the bottom bracket 121 of the side panel 120, while on the other side it rests on the bracket 131 of the side panel 130, the position of which is shifted upwards with respect to the bracket 121. Consequently, in order to prevent the frame from being wobbly, it is preferable to add this apertured part 128, 138. However, this apertured part is optional since the dissymmetry of the frame is not disturbed by its depthwise adjustment.

FIGS. 3A and 3B show more clearly how the depth of the frame and the position of the plug-in units with respect to an integrating rack are adjusted. They show diagrammatically a top view of an integrating rack 500, such as a cabinet for example, containing a frame 100 according to the invention, which supports electronic plug-in units 400.

In FIG. 3A, the plug-in units 400 are fixed flush with the opening in the integrating rack 500—they are also said to be in the flush position. In this case, the connection pins 410 lying on the front panel of one of the plug-in units protrude from the cabinet. This protrusion of the connection pins therefore prevents the door of the cabinet being closed. In addition, the connection pins can be damaged by impacts due to the fact that people passing a little too close to the cabinet brush against them.

The brackets 121, 133 incorporated at the front of the side panels 120, 130 of the frame 100 are fixed to the integrating rack, for example by screwing.

The plug-in units 400 are fixed to the integrating rack 500 by means of the other brackets 141, 153. These brackets are fixed to the side walls of the plug-in units in a first position P1'.

Moreover, the returns 111 in the backplane 110 of the frame 100 are fixed to the side panels 120, 130 in a first position P1 furthest away from the rear of the side panels, so that the frame has a minimum depth $P_{min}$.

The motherboard 600 is fixed to the backplane 110 and allows the various electronic plug-in units to be interconnected. The distance d between the backplane 110 and the rear of the plug-in units is therefore very large and must be kept constant in order to maintain good-quality connection between the plug-in units 400 and the motherboard 600.

In general, the depth of the plug-in units is equal to 240 mm and the depth of the standard integrating racks is either 450 mm or 600 mm.

In order to be able to close the door of the cabinet 500, the plug-in units 400 must necessarily be set back with respect to this cabinet 500, as illustrated diagrammatically in FIG. 3B. The backplane 110 of the frame 100 according to the invention is therefore moved back so as to increase the depth of the frame. To do this, the returns 111 are fixed to the side panels 120, 130 in the second position P2 lying further to the rear of the side panels. In this way, the frame has a maximum depth $P_{max}$.

Having increased the depth of the frame, it is then possible to move the plug-in units 400 in the frame so as to maintain the distance d between the backplane and the rear of the plug-in units. In order to be able to move the plug-in units back, the brackets 141, 153 are moved forward with respect to the plug-in units and are fixed to the side walls of the plug-in units in the second position P2' lying furthest forward.

The backplane 110 and the side panels 120, 130 are screwed together on site, i.e. when fitting the electronic plug-in units into an integrating rack.

Preferably, the distance between the two fixing positions P1, P2 of the backplane and between the two fixing positions P1', P2' of the brackets 141, 153 is about 40 mm.

FIGS. 4A and 4B illustrate in detail a bracket 141 for fixing a plug-in unit 400 to the rack. This bracket 141 has first leg 160 intended to be fixed to a side wall of a plug-in unit and second leg 170 intended to be fixed to the integrating r 500.

Four holes 161, 162, 163, 164 are made in the leg 160. They are intended to receive screws, for example for fixing the bracket 141 to a plug-in unit. When the bracket 141 is fixed in its first position P1', as illustrated in FIG. 4A, the four holes 161, 162, 163, 164 are placed so as to be aligned with four threaded holes made in the side wall of the plug-in unit. Three of these threaded holes can be seen in FIG. 4A and are labelled 422, 423, 424. Screws allow the bracket to be held in place.

On the other hand, when the bracket 141 is fixed in its second position P2', as illustrated in FIG. 4B, only the holes 163, 164 lying along the rear end of the bracket are placed so as to be aligned with the threaded holes 422, 421 made in the side wall of the plug-in unit and close to its front panel. Screws placed in these holes make it possible to hold the bracket in place.

A single hole 171 is made in the leg 170. This hole is intended to receive a screw, for example for allowing the bracket 141 to be fixed to the integrating rack.

The bracket illustrated in FIGS. 4A and 4B is in fact a half-bracket, the leg 170 of which is intended to be fitted between the brackets of the frame 100. However, in one embodiment, when the plug-in units are fitted directly into an integrating rack, the leg 170 of the brackets may have a width equal to the thickness of the plug-in units and have two holes 171 for fixing to the integrating rack.

The dimensions of the frame, in particular its thickness and its length, are adapted to those of the plug-in units. The minimum height of the electronic plug-in units is standardized. This height can then be increased n times, n being an integer greater than or equal to 2. The frame according to the invention is intended to support three electronic plug-in units. Consequently, its minimum height is equal to three times the normalized height of a plug-in unit. More generally, its height is equal to m times the normalized height of a plug-in unit, m being an integer greater than or equal to 3.

Having fixed the plug-in units to the frame, it is possible to remove one of them therefrom without thereby dismantling the frame or the other two plug-in units with respect to the integrating rack and without disconnecting the other two plug-in units from the motherboard.

In one embodiment, it is furthermore possible to insert the electronic plug-in units 400 directly into the integrating rack 500. In this case, the plug-in units are set back with respect to the rack by virtue of the adjustment in the position of the brackets 141, 142, 143, 151, 152, 153. However, this embodiment involves interconnection of the plug-in units by means of ribbon cables which prevent their rear panel from being sealed. In this case, it is therefore not possible to protect the electronic plug-in units from electromagnetic waves.

What is claimed is:

1. A frame having two side panels and a backplane coupled to the back ends of the panels for insertion into an integrating rack to support at least one electronic plug-in unit comprising first and second fixing positions located at the back end of each side panel for fixing the backplane with respect to the side panels to allow its depth to be adjusted; a first bracket having a first leg coupled to the integrating rack and a second leg coupled to the front end of a side panel; a second bracket having a first leg coupled to the integrating rack and a second leg coupled to the front end of the other side panel; the second leg of each bracket supports apertures located for alignment with others in the front ends of the side panels for fixing the side panels to the brackets to one of two positions to allow an electronic plug-in unit supported by the frame to be fixed to the integrating rack to one of two positions.

2. The frame of claim 1 wherein the side panels are similar.

3. The frame of claim 1 wherein its height is equal to m times the normalized height of a plug-in unit, m being an integer greater than or equal to 3.

4. The frame of claim 3 comprising studs coupled to the backplane.

5. The frame of claim 1 wherein its height is equal to 3 times the normalized height of an electronic plug-in unit.

6. The frame of claim 5 comprising a motherboard fixed to the backplane to enable electronic plug-in units to be interconnected.

* * * * *